(12) United States Patent
Zhang et al.

(10) Patent No.: US 12,217,531 B2
(45) Date of Patent: Feb. 4, 2025

(54) TEXTURE RECOGNITION DEVICE AND DISPLAY APPARATUS

(71) Applicants: BEIJING BOE SENSOR TECHNOLOGY CO., LTD., Beijing (CN); BOE TECHNOLOGY GROUP CO., LTD., Beijing (CN)

(72) Inventors: Jie Zhang, Beijing (CN); Shoujin Cai, Beijing (CN); Jin Cheng, Beijing (CN); Dexi Kong, Beijing (CN); Cheng Li, Beijing (CN); Yingzi Wang, Beijing (CN)

(73) Assignees: BEIJING BOE SENSOR TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/784,801

(22) PCT Filed: Jun. 22, 2021

(86) PCT No.: PCT/CN2021/101562
§ 371 (c)(1),
(2) Date: Dec. 29, 2022

(87) PCT Pub. No.: WO2022/266847
PCT Pub. Date: Dec. 29, 2022

(65) Prior Publication Data
US 2024/0185631 A1  Jun. 6, 2024

(51) Int. Cl.
*G06V 40/13* (2022.01)
*H01L 27/146* (2006.01)

(52) U.S. Cl.
CPC .... *G06V 40/1318* (2022.01); *H01L 27/14603* (2013.01); *H01L 27/14623* (2013.01); *H01L 27/14627* (2013.01); *H01L 27/14678* (2013.01)

(58) Field of Classification Search
None
See application file for complete search history.

(56) References Cited

U.S. PATENT DOCUMENTS 9,690,971 B2   6/2017   Liao et al.
10,763,315 B2  9/2020   Bang et al.
(Continued)

FOREIGN PATENT DOCUMENTS

CN     1881565 A    12/2006
CN   101494256 A     7/2009
(Continued)

*Primary Examiner* — Joseph R Haley
(74) *Attorney, Agent, or Firm* — Dilworth & Barrese, LLP.; Michael J. Musella, Esq.

(57) ABSTRACT

A texture recognition device and a display apparatus are provided, the texture recognition device has a plurality of pixel units, and includes a base substrate, a driving circuit layer, a first electrode layer and a photosensitive element layer; at least one of the plurality of pixel units includes a pixel driving circuit in the driving circuit layer, a first electrode in the first electrode layer, and a plurality of photosensitive elements spaced apart from each other in the photosensitive element layer, the pixel driving circuit is electrically connected with the first electrode, the plurality of photosensitive elements are on a side of the first electrode away from the base substrate, and are electrically connected to the pixel driving circuit through the first electrode.

19 Claims, 9 Drawing Sheets

(56) References Cited

U.S. PATENT DOCUMENTS

| | | | |
|---|---|---|---|
| 11,894,470 B2* | 2/2024 | Lee | H01L 31/105 |
| 2006/0284223 A1 | 12/2006 | Kim | |
| 2008/0029787 A1* | 2/2008 | Watanabe | H01L 27/14641 |
| | | | 257/E31.085 |
| 2014/0117316 A1 | 5/2014 | Choi et al. | |
| 2016/0232397 A1 | 8/2016 | Yu et al. | |
| 2019/0006441 A1 | 1/2019 | Ling et al. | |
| 2021/0167134 A1 | 6/2021 | Li et al. | |
| 2021/0248341 A1* | 8/2021 | Lin | H10K 59/65 |
| 2022/0067326 A1* | 3/2022 | Wang | H01L 27/14625 |

FOREIGN PATENT DOCUMENTS

| | | |
|---|---|---|
| CN | 105390518 A | 3/2016 |
| CN | 105683993 A | 6/2016 |
| CN | 106654067 A | 5/2017 |
| CN | 110970475 A | 4/2020 |
| CN | 111653599 A | 9/2020 |
| EP | 3451381 A1 | 3/2019 |

\* cited by examiner

AT

E2

V2

E30   E3

TEXTURE RECOGNITION DEVICE AND DISPLAY APPARATUS

TECHNICAL FIELD

Embodiments of the present disclosure relate to a texture recognition device and a display apparatus.

BACKGROUND

Because of the uniqueness of skin textures such as fingerprint patterns or palm print patterns, fingerprint recognition technology combined with optical imaging is gradually adopted by mobile electronic devices for identity verification, electronic payment, etc. At present, display screens of electronic products, such as mobile phones and tablet computers, are developing towards large screen and full screen, and in this regard, how to design a more optimized texture recognition device is a focus problem in the art.

SUMMARY

At least one embodiment of the present disclosure provides a texture recognition device, the texture recognition device has a plurality of pixel units, and comprises a base substrate, a driving circuit layer, a first electrode layer and a photosensitive element layer; the driving circuit layer is on the base substrate, the first electrode layer is on a side of the driving circuit layer away from the base substrate, the photosensitive element layer is on a side of the first electrode layer away from the base substrate, at least one of the plurality of pixel units comprises a pixel driving circuit in the driving circuit layer, a first electrode in the first electrode layer, and a plurality of photosensitive elements spaced apart from each other in the photosensitive element layer, the pixel driving circuit is electrically connected with the first electrode, the plurality of photosensitive elements are on a side of the first electrode away from the base substrate, and are electrically connected with the pixel driving circuit through the first electrode.

For example, the texture recognition device provided by at least one embodiment of the present disclosure further comprises an interlayer insulation layer between the driving circuit layer and the first electrode layer, the interlayer insulation layer comprises a via, and the first electrode is electrically connected with the pixel driving circuit through the via; an orthographic projection of the via on the base substrate does not overlap with orthographic projections of the plurality of photosensitive elements on the base substrate.

For example, in the texture recognition device provided by at least one embodiment of the present disclosure, the first electrode comprises at least one first hollowed-out portion between two adjacent photosensitive elements of the plurality of photosensitive elements.

For example, in the texture recognition device provided by at least one embodiment of the present disclosure, each of the at least one first hollowed-out portion has a length ranging from 6 μm to 40 μm and a width ranging from 2.5 μm to 10 μm.

For example, in the texture recognition device provided by at least one embodiment of the present disclosure, at least one of the plurality of pixel units includes a plurality of photosensitive elements arranged in an M*N array, M is a positive integer greater than or equal to 1, and N is a positive integer greater than 1.

For example, in the texture recognition device provided by at least one embodiment of the present disclosure, M is 2, N is 2, and the plurality of photosensitive elements are arranged in a 2*2 array.

For example, the texture recognition device provided by at least one embodiment of the present disclosure further comprises a second electrode layer on a side of the photosensitive element layer away from the base substrate, the at least one pixel unit further comprises a plurality of second electrodes in the second electrode layer, and the plurality of second electrodes are respectively on a side of the plurality of photosensitive elements away from the base substrate.

For example, in the texture recognition device provided by at least one embodiment of the present disclosure, orthographic projections of the second electrodes on the base substrate do not overlap with the orthographic projection of the via on the base substrate.

For example, the texture recognition device provided by at least one embodiment of the present disclosure further comprises a third electrode layer on a side of the second electrode layer away from the base substrate, the plurality of second electrodes are electrically connected with the third electrode layer.

For example, in the texture recognition device provided by at least one embodiment of the present disclosure, the third electrode layer comprises at least one second hollowed-out portion between two adjacent pixel units of the plurality of pixel units.

For example, in the texture recognition device provided by at least one embodiment of the present disclosure, the driving circuit layer further comprises a signal scanning line electrically connected with the pixel driving circuit, an orthographic projection of the at least one second hollowed-out portion on the base substrate at least partially overlaps with an orthographic projection of the signal scanning line on the base substrate.

For example, in the texture recognition device provided by at least one embodiment of the present disclosure, the second hollowed-out portion at least partially overlapping with the signal scanning line has a length ranging from 20 μm to 97 μm, and has a width ranging from 6 μm to 20 μm.

For example, in the texture recognition device provided by at least one embodiment of the present disclosure, the driving circuit layer further comprises a signal readout line electrically connected with the pixel driving circuit, an orthographic projection of the at least one second hollowed-out portion on the base substrate at least partially overlaps with an orthographic projection of the signal readout line on the base substrate.

For example, in the texture recognition device provided by at least one embodiment of the present disclosure, the second hollowed-out portion at least partially overlapping with the signal readout line has a length ranging from 8 μm to 97 μm, and has a width ranging from 2.5 μm to 20 μm.

For example, the texture recognition device provided by at least one embodiment of the present disclosure further comprises an electrostatic shielding layer on a side of the third electrode layer away from the base substrate, an orthographic projection of the third electrode layer on the base substrate is within an orthographic projection of the electrostatic shielding layer on the base substrate.

For example, the texture recognition device provided by at least one embodiment of the present disclosure further comprises a first diaphragm layer on a side of the electrostatic shielding layer away from the base substrate, the first diaphragm layer comprises a plurality of first light transmission openings, in a direction perpendicular to a board surface of the base substrate, the first light transmission openings are in one-to-one correspondence with and overlap with the plurality of photosensitive elements.

For example, the texture recognition device provided by at least one embodiment of the present disclosure further comprises a second diaphragm layer on a side of the first diaphragm layer away from the base substrate, the second diaphragm layer comprises a plurality of second light transmission openings, in the direction perpendicular to the board surface of the base substrate, the second light transmission openings are in one-to-one correspondence with and overlap with the plurality of photosensitive elements.

For example, in the texture recognition device provided by at least one embodiment of the present disclosure, in a direction parallel to the board surface of the base substrate, a diameter of each of the plurality of first light transmission openings is D1, a diameter of each of the plurality of second light transmission openings is D2, and 2 µm≤D1≤D2≤50 µm.

For example, the texture recognition device provided by at least one embodiment of the present disclosure further comprises a visual field diaphragm layer between the electrostatic shielding layer and the first diaphragm layer, the visual field diaphragm layer comprises a plurality of third light transmission openings, in the direction perpendicular to the board surface of the base substrate, the third light transmission openings are in one-to-one correspondence with and overlap with the plurality of photosensitive elements.

For example, the texture recognition device provided by at least one embodiment of the present disclosure further comprises an optical filter layer between the visual field diaphragm layer and the first diaphragm layer, the optical filter layer is configured to filter out light with a wavelength ranging from 580 nm to 850 nm.

For example, the texture recognition device provided by at least one embodiment of the present disclosure further comprises a lens layer on a side of the second diaphragm layer away from the base substrate, the lens layer comprises a plurality of lens units, and in the direction perpendicular to the board surface of the base substrate, the plurality of lens units are in one-to-one correspondence with and overlap with the plurality of photosensitive elements.

For example, the texture recognition device provided by at least one embodiment of the present disclosure further comprises a planarization layer on a side of the lens layer away from the base substrate, a refractive index of a material of the planarization layer ranges from 1.35 to 1.45.

For example, in the texture recognition device provided by at least one embodiment of the present disclosure, the pixel driving circuit comprises a first thin film transistor, a second thin film transistor and a third thin film transistor; a control terminal of the first thin film transistor is connected with a signal scanning line, and a first source-drain terminal of the first thin film transistor and a second source-drain terminal of the first thin film transistor are respectively connected with a signal readout line and a first source-drain terminal of the second thin film transistor; a control terminal of the second thin film transistor is connected with a first source-drain terminal of the third thin film transistor, and a second source-drain terminal of the second thin film transistor is connected with a power line; a control terminal of the third thin film transistor is connected with a reset signal line, and a second source-drain terminal of the third thin film transistor is connected with the power line.

For example, in the texture recognition device provided by at least one embodiment of the present disclosure, for the pixel driving circuit of each of the plurality of pixel units, the first thin film transistor and the second thin film transistor are arranged on a first side of the via comprised in the interlayer insulation layer, and the third thin film transistor is arranged on a second side of the via, and the first side and the second side are opposite to each other.

For example, in the texture recognition device provided by at least one embodiment of the present disclosure, an orthographic projection of the power line on the base substrate partially overlaps with an orthographic projection of at least part of the plurality of photosensitive elements on the base substrate.

At least one embodiment of the present disclosure provides a display apparatus, the display apparatus comprises a display panel and the texture recognition device provided by the embodiments of the present disclosure, the display panel has a display side and a non-display side and allows light to be transmitted from the display side to the non-display side, and the texture recognition device is on the non-display side of the display panel and is configured to receive the light transmitted from the display side to the non-display side for texture recognition, the photosensitive element layer is closer to the display panel than the base substrate.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative of the present disclosure.

DETAILED DESCRIPTION

Figure 1:
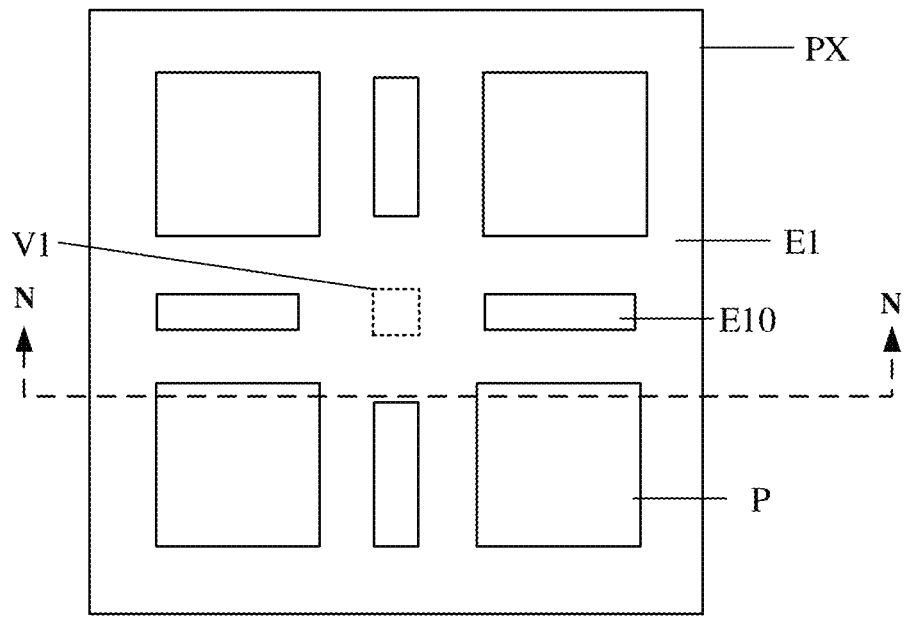
FIG. 1 is a schematic planar view of a texture recognition device provided by at least one embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

In a display apparatus, a texture recognition device may be provided on the non-display side of the display panel, and the display panel at least partially transmit light, so that the texture recognition device can receive signal light through the display panel, thus the display apparatus has both display function and texture recognition function. In the current display apparatus, the texture recognition device usually has a plurality of pixel units for recognizing signal light and synthesizing texture images. The plurality of pixel units can respectively adopt a collimating film material with a micro-lens structure as a light path system to collimate light entering the texture recognition device, so that the collimated light can be more easily recognized and the light utilization rate can be improved. For example, each pixel unit includes a photosensitive element, and the photosensitive element is correspondingly provided with a micro-lens structure, so that the micro-lens structure can be used to collimate the light incident on the photosensitive element.

However, the inventor(s) of the present disclosure found that the traditional micro-lens structure is difficult to match with the photosensitive element included in each pixel unit, thus it is difficult to effectively collimate light incident into each pixel unit; in addition, because each pixel unit further has a corresponding pixel driving circuit which is arranged under the photosensitive element so as not to affect signal light received by the photosensitive element, the pixel driving circuit is electrically connected with the photosensitive element to drive the pixel driving circuit. However, the pixel driving circuit is usually uneven, and the uneven pixel driving circuit arranged under the photosensitive element can deform the structure of the photosensitive element, and then affect the characteristics of the photosensitive element, resulting in a series of problems, such as dark current, of the photosensitive element, which affects the recognition effect of the texture recognition device.

At least one embodiment of the present disclosure provides a texture recognition device and a display apparatus, the texture recognition device has a plurality of pixel units, and includes a base substrate, a driving circuit layer, a first electrode layer and a photosensitive element layer; the driving circuit layer is on the base substrate, the first electrode layer is on a side of the driving circuit layer away from the base substrate, and the photosensitive element layer is on a side of the first electrode layer away from the base substrate; at least one of the plurality of pixel units includes a pixel driving circuit in the driving circuit layer, a first electrode in the first electrode layer, and a plurality of photosensitive elements spaced apart from each other in the photosensitive element layer, the pixel driving circuit is electrically connected with the first electrode, the plurality of photosensitive elements are on a side of the first electrode away from the base substrate, and are electrically connected with the pixel driving circuit through the first electrode.

In the texture recognition device provided by at least one embodiment of the present disclosure, at least one pixel unit includes the plurality of photosensitive elements, the plurality of photosensitive elements are driven by the same one first electrode connected to the same one pixel driving circuit. In this case, the first electrode can be electrically connected with the pixel driving circuit through one via to realize the electrical connection between the plurality of photosensitive elements and the same one pixel driving circuit, thereby reducing the number of vias used for the electrical connection, facilitating the selection of the positions of vias, and further facilitating the flatness of the pixel driving circuit; on the other hand, the plurality of photosensitive elements included in at least one pixel unit are driven by the same one pixel driving circuit, so as to be in the same working state, and the pixel unit can receive enough signal light through the plurality of photosensitive elements and synthesize a texture image.

In the following, the texture recognition device and the display apparatus provided by embodiments of the present disclosure are introduced in detail by several specific embodiments.

Figure 2:
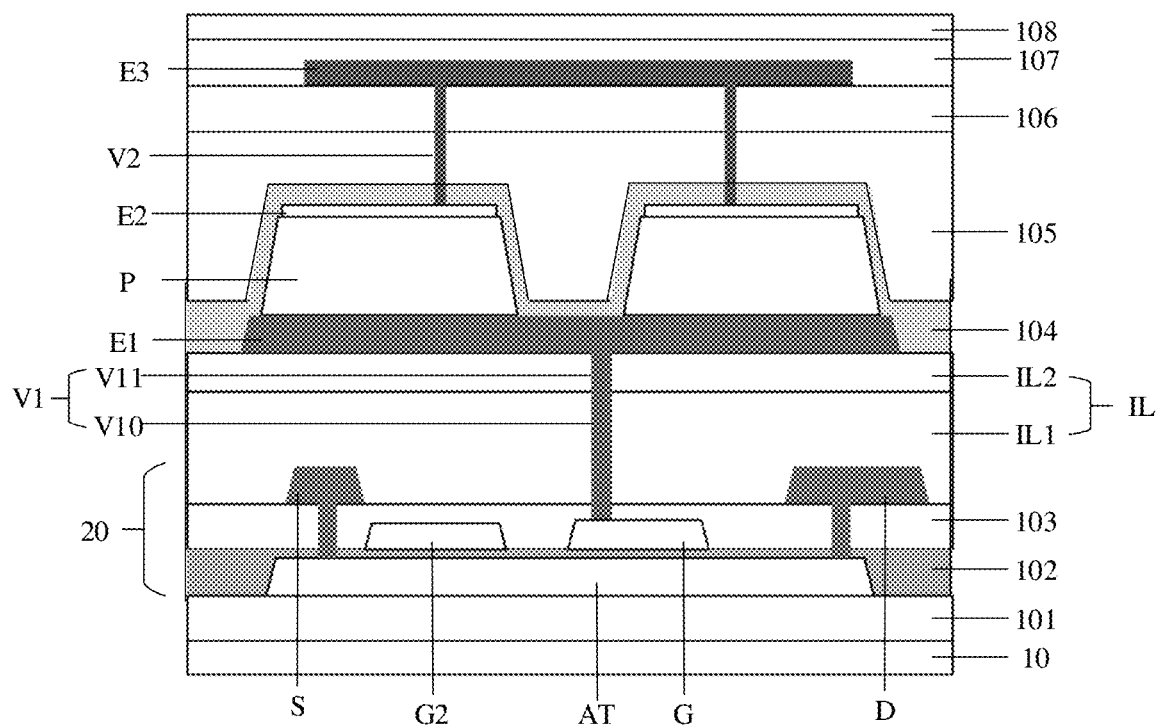
FIG. 2 is a schematic cross-sectional view of the texture recognition device in FIG. 1 taken along a line N-N.

FIG. 1 is a schematic planar view of a texture recognition device provided by at least one embodiment of the present disclosure, and FIG. 2 is a schematic cross-sectional view of the texture recognition device in FIG. 1 taken along a line N-N.

As shown in FIG. 1 and FIG. 2, the texture recognition device has a plurality of pixel units PX, for example, the plurality of pixel units PX are arranged in an array, and one pixel unit PX is shown in FIG. 1 as an example. As shown in FIG. 2, the texture recognition device includes a base substrate 10, a driving circuit layer 20, a first electrode layer and a photosensitive element layer. The driving circuit layer 20 is disposed on the base substrate 10, the first electrode layer is disposed on the side of the driving circuit layer 20 away from the base substrate 10, and includes a plurality of first electrodes E1 used for the plurality of pixel units PX, and the photosensitive element layer is disposed on the side of the first electrode layer away from the base substrate 10 and includes a plurality of photosensitive elements used for the plurality of pixel units PX.

For example, at least one of the plurality of pixel units PX includes a pixel driving circuit provided in the driving circuit layer 20, a first electrode E1 provided in the first electrode layer, and a plurality of photosensitive elements P spaced apart from each other in the photosensitive element layer. As an example, four photosensitive elements P arranged in a 2*2 array are shown in FIG. 1. The pixel driving circuit is electrically connected with the first electrode E1, and the plurality of photosensitive elements P are provided on the side of the first electrode E1 away from the base substrate 10 and electrically connected with the pixel driving through the first electrode E1.

Therefore, the plurality of photosensitive elements P included in the at least one pixel unit PX are connected to the same one pixel driving circuit by the same one first electrode E1. In this case, the first electrode E1 can be electrically connected with the pixel driving circuit through one via (that is, the via V1 in the figure) to realize the electrical connection between the photosensitive elements P and the same one pixel driving circuit, thereby reducing the number of the via V1 for this electrical connection, facilitating the selection of the position of the via V1, and further facilitating the flatness of the pixel driving circuit. On the other hand, the plurality of photosensitive elements P included in the at least one pixel unit PX are driven by the same one pixel driving circuit so as to be in the same working state, and the pixel unit PX can receive enough signal light by the plurality of photosensitive elements P and synthesize a texture image.

Figure 3:
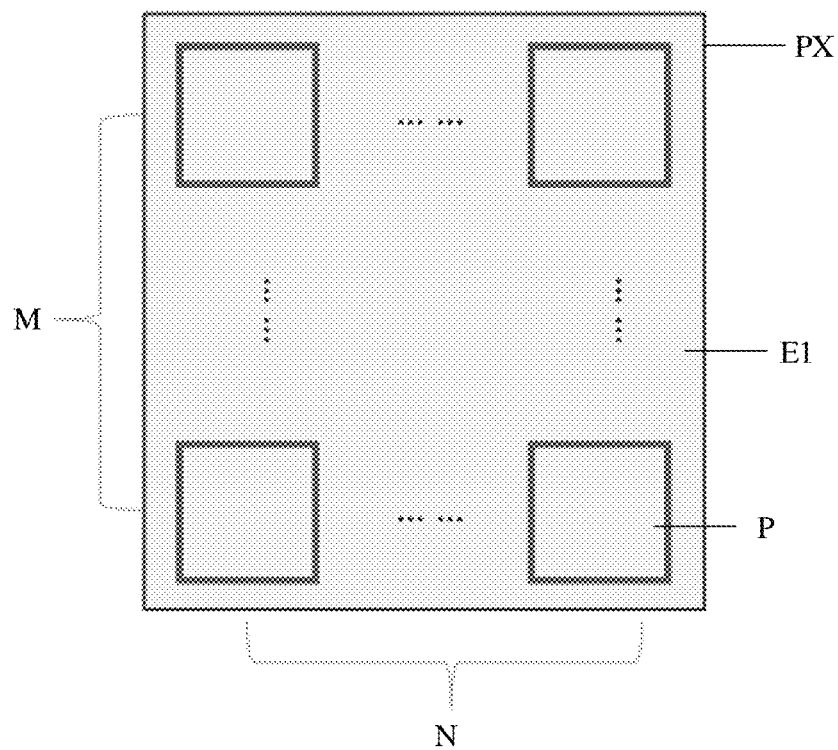
FIG. 3 is another schematic planar view of a texture recognition device provided by at least one embodiment of the present disclosure.

For example, in the embodiments of the present disclosure, the plurality of photosensitive elements P included in at least one of the plurality of pixel units may be arranged in an M*N array, in which M is a positive integer greater than or equal to 1, and N is a positive integer greater than 1. For example, FIG. 3 shows a schematic arrangement diagram of the plurality of photosensitive elements P provided by some embodiments of the present disclosure. As shown in FIG. 3, in some examples, the plurality of photosensitive elements P may be arranged in an array including M rows and N columns, such as an array including 2 rows and 3 columns (2*3), an array including 3 rows and 3 columns (3*3) or an array including 4 rows and 4 columns (4*4), etc., and the embodiments of the present disclosure are not limited in this aspect.

Figure 4:
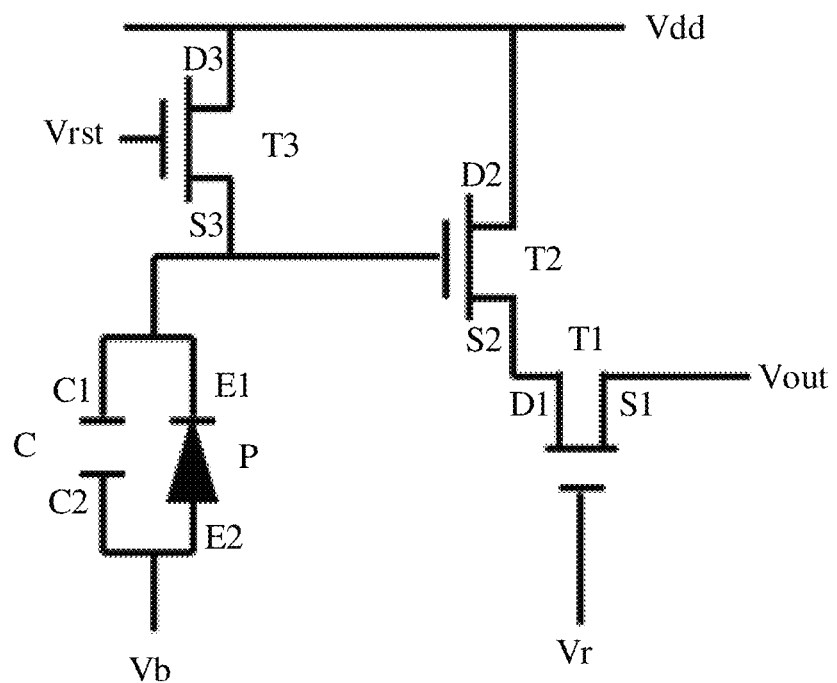
FIG. 4 is a circuit diagram of a pixel driving circuit and a photosensitive element in a texture recognition device provided by at least one embodiment of the present disclosure.

For example, in some embodiments, the pixel driving circuit of each pixel unit PX includes at least one thin film transistor, and may further include a capacitor and other structures. For example, FIG. 4 illustrates a circuit diagram of the pixel driving circuit connected with the photosensitive element P provided by at least one embodiment of the present disclosure. In this example, the pixel driving circuit includes a first thin film transistor T1, a second thin film transistor T2, a third thin film transistor T3, and a capacitor C.

For example, as shown in FIG. 4, the first thin film transistor T1 serves as a switch transistor, the control terminal of the first thin film transistor T1 is connected to a signal scanning line Vr, and the first source-drain terminal S1 of the first thin film transistor T1 and the second source-drain terminal D1 of the first thin film transistor T1 are respectively connected to a signal readout line Vout and the first source-drain terminal S2 of the second thin film transistor T2. The second thin film transistor T2 serves as a driving transistor, the control terminal of the second thin film transistor T2 is connected to the first source-drain terminal S3 of the third thin film transistor T3, the first capacitor plate C1 of the capacitor C and the first electrode E1 of the photosensitive element P, and the second source-drain terminal D2 of the second thin film transistor T2 is connected to the power supply line Vdd. The third thin film transistor T3 serves as a reset transistor, the control terminal of the third thin film transistor T3 is connected to a reset signal line Vrst, and the second source-drain terminal D3 of the third thin film transistor T3 is connected to the power supply line Vdd. The second capacitor plate C2 of the capacitor C and the second electrode E2 of the photosensitive element P are connected to a bias line Vb. For example, in FIG. 4, only one photosensitive element P is shown as an example, but actually, there may be a plurality of photosensitive elements P connected in parallel.

For example, in the circuit shown in FIG. 4, the working process of the photosensitive element P includes the following steps. First, in the reset stage, a reset signal is input to the control terminal of the third thin film transistor T3 through the reset signal line Vrst to turn on the third thin film transistor T3, and the reset signal is written into the first electrode E1 of the photosensitive element P and the control terminal of the second thin film transistor T2; then, in the photosensitive stage, the photosensitive element P generates photo-generated carriers to generate a photo-generated leakage current under the irradiation of signal light, and charges the capacitor C, so that the capacitor C generates an electrical signal and stores the electrical signal; finally, in the detection stage, a scanning signal is input to the control terminal of the first thin film transistor T1 through the signal scanning line Vr to turn on the first thin film transistor T1, and the texture recognition chip reads the electric signal stored by the capacitor C from the first thin film transistor T1 and the second thin film transistor T2 through the signal readout line Vout, and then a texture image is formed.

For example, in FIG. 2, only one thin film transistor is shown, for example, the only one thin film transistor is the second thin film transistor T2 mentioned above, and the thin film transistor includes structures such as an active layer AT, a gate electrode G, a source electrode S and a drain electrode D. For example, the gate electrode G serves as the control terminal of the second thin film transistor T2, the source electrode S serves as the first source-drain terminal of the second thin film transistor T2, and the drain electrode D serves as the second source-drain terminal of the second thin film transistor T2. For example, another gate electrode G2 is shown in FIG. 2, which is the gate electrode of the first thin film transistor T1. Other structures of the first thin film transistor T1 and the third thin film transistor T3 are not shown in FIG. 2. For example, the first thin film transistor T1 and the third thin film transistor T3 have structures similar to those of the second thin film transistor T2, and the specific structures of the first thin film transistor T1, the second thin film transistor T2 and the third thin film transistor T3 are not limited in the embodiments of the present disclosure.

For example, in some embodiments, as shown in FIG. 2, the texture recognition device further includes an interlayer insulation layer IL, the interlayer insulation layer IL is disposed between the driving circuit layer 20 and the first electrode layer, and the interlayer insulation layer IL includes the via V1, the first electrode E1 is electrically connected to the pixel driving circuit through the via V1, and for example, the first electrode E1 is electrically connected to the gate electrode G of the second thin film transistor T2 in the pixel driving circuit. For example, the orthographic projection of the via V1 on the base substrate 10 does not overlap with the orthographic projections of the plurality of photosensitive elements P on the base substrate 10.

Because the position where the via V1 is located is uneven, by allowing the via V1 and the plurality of photosensitive elements P to be non-overlapping with each other in a direction perpendicular to a board surface of the base substrate 10, it is possible to prevent the uneven part from being right under the photosensitive elements P to deform the structures of the photosensitive elements, thereby ensuring the structural accuracy of the photosensitive elements and improving the photosensitive effect of the photosensitive elements.

For example, in some embodiments, the interlayer insulation layer is a planarization layer, which is used to planarize the pixel driving circuit, so as to facilitate the arrangement of the first electrode layer above the planarization layer. For example, in some embodiments, as shown in FIG. 2, the interlayer insulation layer may include a stack of a plurality of sub-insulation layers, and for example, the sub-insulation layers include a planarization layer IL1 and a first passivation layer IL2, a via V10 is provided in the planarization layer IL1, a via V11 is provided in the first passivation layer IL2, and the via V10 and the via V11 communicate with each other to form the via V1 in the interlayer insulation layer IL. For example, in other embodiments, the interlayer insulation layer may include a stack of more sub-insulation layers, and the embodiments of the present disclosure do not limit the specific form of the interlayer insulation layer IL.

For example, in some embodiments, the first electrode E1 of each pixel unit PX is a continuous integral structure disposed under the plurality of photosensitive elements; or, in other embodiments, as shown in FIG. 1, the first electrode E1 includes at least one first hollowed-out portion E10 disposed between two adjacent photosensitive elements P of the plurality of photosensitive elements P. For example, the first electrode E1 includes a plurality of first hollowed-out portions E10 disposed between every two adjacent photosensitive elements P of the plurality of photosensitive elements P. The first hollowed-out portion E10 can prevent the first electrode E1 from generating a coupling capacitance with the circuit disposed above or below the first electrode E1, and thus avoid signal crosstalk and other undesirable phenomena.

For example, in some embodiments, as shown in FIG. 2, the texture recognition device further includes a second electrode layer, the second electrode layer is arranged on the side of the photosensitive element layer away from the base substrate 10. For example, the at least one pixel unit PX further includes a plurality of second electrodes E2 disposed in the second electrode layer, and the plurality of second electrodes E2 are respectively disposed on the side of the plurality of photosensitive elements P away from the base substrate 10. The first electrode E1 and the plurality of second electrodes E2 jointly drive the plurality of photosensitive elements P; on the other hand, the first electrode E1 and the plurality of second electrodes E2 can further constitute the capacitor C.

For example, in some embodiments, the orthographic projections of the plurality of second electrodes E2 on the base substrate 10 do not overlap with the orthographic projection of the via V1 on the base substrate 10. For example, the plurality of second electrodes E2 are arranged at intervals in the second electrode layer, and the orthographic projection of the second electrode E2 arranged on each photosensitive element P on the base substrate 10 is within the orthographic projection of the each photosensitive element P on the base substrate 10, so as to ensure the flatness of the second electrode E2, and further ensure the accuracy of electric signal transmission of the second electrode E2.

For example, in some embodiments, as shown in FIG. 2, the texture recognition device may further include a third electrode layer E3, the third electrode layer E3 is disposed on the side of the second electrode layer away from the base substrate 10, and the plurality of second electrodes E2 are electrically connected with the third electrode layer E3. For example, the third electrode layer E3 is connected to the bias line Vb, and in this way, each second electrode E2 acquires the same electrical signal from the bias line Vb through the third electrode layer E3.

For example, in some embodiments, the third electrode layer E3 includes at least one second hollowed-out portion E30 disposed between two adjacent pixel units PX of the plurality of pixel units PX. For example, the third electrode layer E3 includes a plurality of second hollowed-out portions E30 disposed between every two adjacent pixel units PX of the plurality of pixel units PX. The second hollowed-out portion E30 can prevent the third electrode layer E3 from generating a coupling capacitance with the circuits disposed above or below the third electrode layer E3, and thus avoid signal crosstalk and other undesirable phenomena.

For example, as shown in FIG. 2, the texture recognition device may further include a first buffer layer 101 disposed on the base substrate 10, a first gate insulation layer 102 disposed on the active layer AT, a second gate insulation layer 103 disposed on the gate electrode G, a second buffer layer 104 disposed on the second electrode layer, an organic insulation layer 105 disposed on the second buffer layer 104, a second passivation layer 106 disposed on the organic insulation layer 105, and a third passivation layer 107 disposed on the third electrode layer E3. For example, the second buffer layer 104, the organic insulation layer 105, and the second passivation layer 106 have a plurality of vias V2, and the second electrodes E2 are respectively connected to the third electrode layer E3 through the vias V2.

For example, in some embodiments, as shown in FIG. 2, the texture recognition device may further include an electrostatic shielding layer 108, the electrostatic shielding layer 108 is arranged on the side of the third electrode layer E3 away from the base substrate 10, and the orthographic projection of the third electrode layer E3 on the base substrate 10 is within the orthographic projection of the electrostatic shielding layer 108 on the base substrate 10. The electrostatic shielding layer 108 can provide electrostatic shielding effect for the third electrode layer E3 and the circuits below the electrostatic shielding layer 108.

For example, in some embodiments, as shown in FIG. 2, the electrostatic shielding layer 108 may be formed into a continuous integral structure on the surface of the third electrode layer E3 or have the same pattern as the third electrode layer E3. For example, the electrostatic shielding layer 108 may have at least one third hollowed-out portion between adjacent pixel units PX, which is not shown in the figure.

Figure 5:
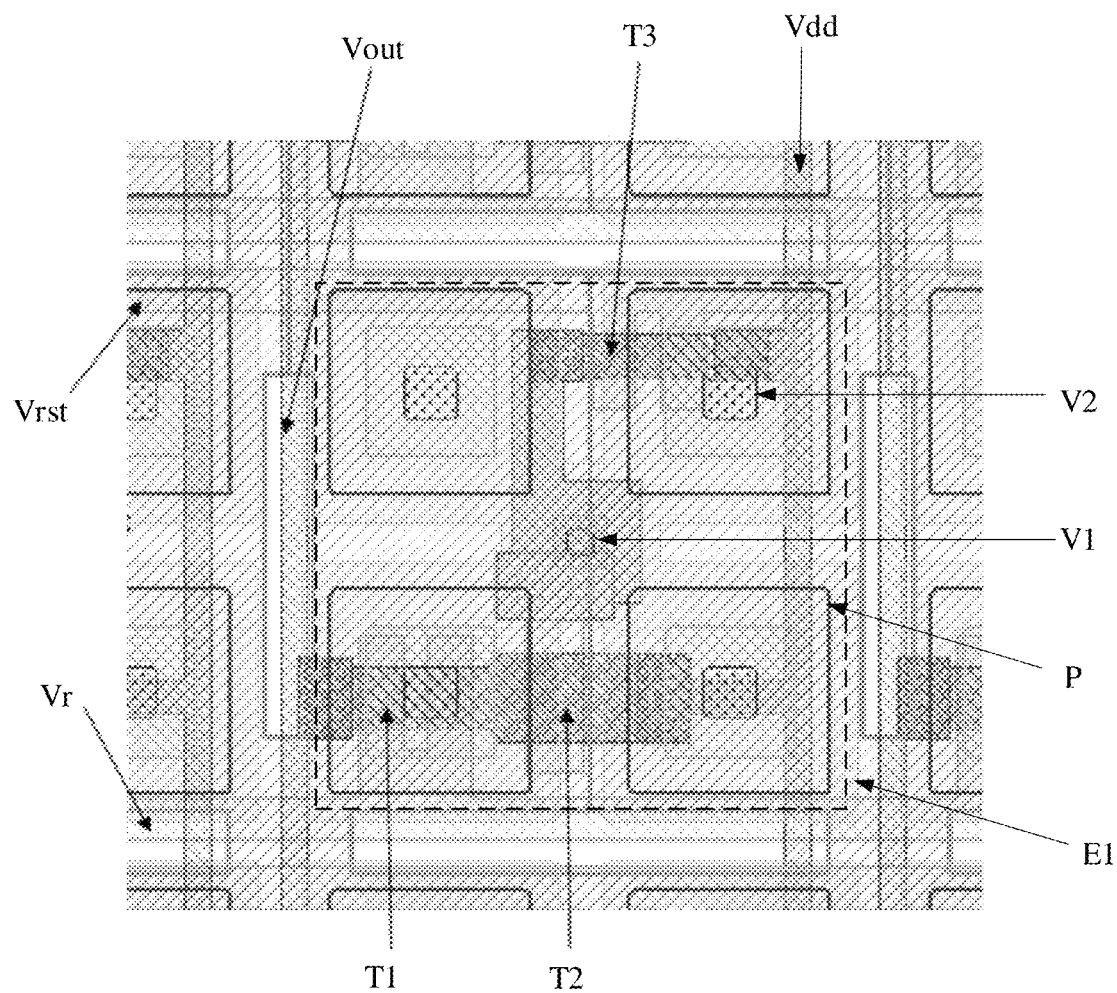
FIG. 5 is further another schematic planar view of a texture recognition device provided by at least one embodiment of the present disclosure.

For example, FIG. 5 shows a schematic planar view of the texture recognition device provided by at least one embodiment of the present disclosure. As shown in FIG. 5, the driving circuit layer includes a pixel driving circuit and signal lines such as a signal scanning line Vr and a signal readout line Vout electrically connected to the pixel driving circuit. The range shown by the dotted line box is one pixel unit, and the range of one pixel unit does not include the signal scanning line Vr and the signal readout line Vout. For example, the signal scanning line Vr extends laterally between adjacent pixel units, and the signal readout line Vout extends longitudinally between adjacent pixel units. For example, the orthographic projection of at least one second hollowed-out portion E30 on the base substrate 10 at least partially overlaps with the orthographic projection of the signal scanning line Vr on the base substrate 10, and the orthographic projection of at least one second hollowed-out portion E30 on the base substrate 10 at least partially overlaps with the orthographic projection of the signal readout line Vout on the base substrate 10. Therefore, the third electrode layer E3 can be prevented from generating a large parasitic capacitance with signal lines such as the signal scanning line Vr and the signal readout line Vout, thereby avoiding adverse phenomena such as signal crosstalk.

For example, as shown in FIG. 5, for the pixel driving circuit of each pixel unit, the first thin film transistor T1, the second thin film transistor T2 and the third thin film transistor T3 are arranged as shown in the figure, that is, the first thin film transistor T1 and the second thin film transistor T2 are provided on the first side (the lower side in the figure) of the via V1 in the interlayer insulation layer, and the third thin film transistor T3 is provided on the second side (the upper side in the figure), and the first side and the second side are opposite to each other.

For example, the orthographic projection of the power supply line Vdd on the base substrate overlaps with the orthographic projection of at least part of the plurality of photosensitive elements on the base substrate. For example, in the example shown in FIG. 5, the power supply line Vdd overlaps with two photosensitive elements P located on the right side in the pixel unit.

For example, FIGS. 6A-6L show schematic planar views of various functional layers of the texture recognition device in FIG. 5.

Figure 6A:
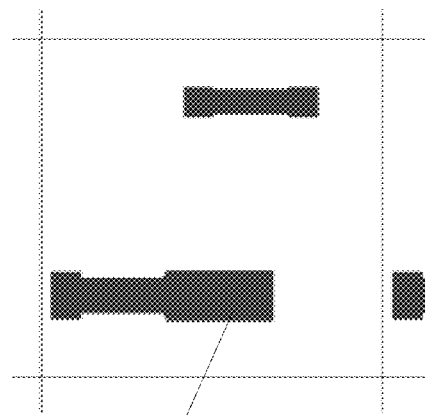
FIGS. 6A-6K are schematic planar views of various structural layers in a texture recognition device provided by at least one embodiment of the present disclosure.

For example, FIG. 6A is a structural schematic diagram of the semiconductor layer where the active layers of the first thin film transistor T1, the second thin film transistor T2 and the third thin film transistor T3 are located in the pixel driving circuit.

Figure 6B:
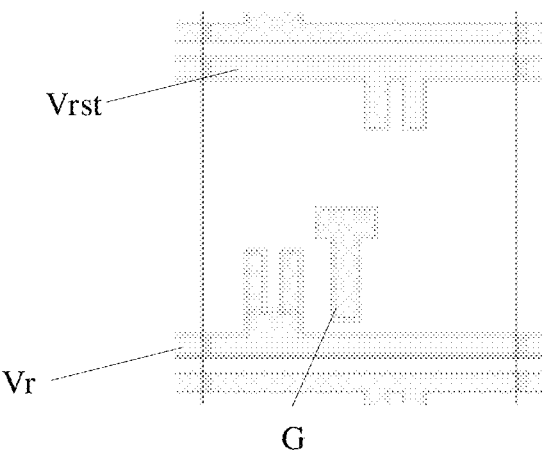

FIG. 6B is a structural schematic diagram of the gate metal layer where the gate electrodes of the first thin film transistor T1, the second thin film transistor T2 and the third thin film transistor T3 are located. For example, the overlapping parts of the gate metal layer and the semiconductor layer constitute the gate electrodes of the first thin film transistor T1, the second thin film transistor T2 and the third thin film transistor T3. For example, the gate metal layer further includes signal lines such as the signal scanning line Vr and the reset signal line Vrst, which extend laterally.

Figure 6C:
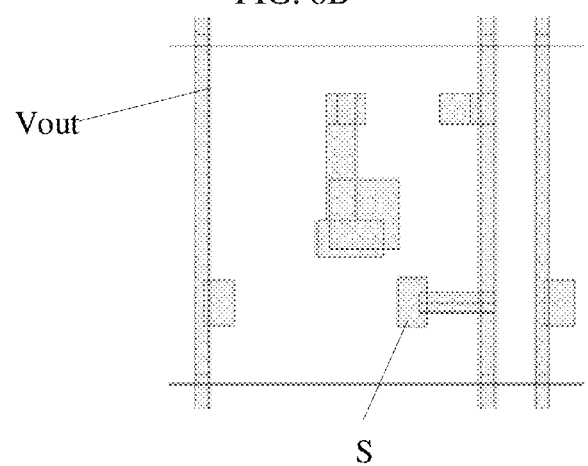

For example, FIG. 6C is a structural schematic diagram of the source and drain metal layer where the source electrodes and the drain electrodes of the first thin film transistor T1, the second thin film transistor T2 and the third thin film transistor T3 are located. For example, the source and drain metal layer further includes signal lines such as the signal readout line Vout. For example, the extension direction of the signal readout line Vout intersects with the extension direction of the signal scanning line Vr and the extension direction of the reset signal line Vrst, for example, the extension direction of the signal readout line Vout is perpendicular to the extension direction of the signal scanning line Vr and the extension direction of the reset signal line Vrst, that is, the signal readout line Vout extends longitudinally in FIG. 6C.

Figure 6D:
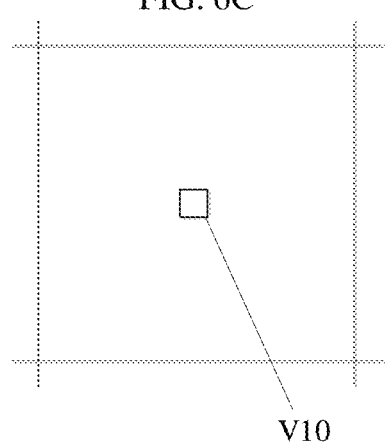
Figure 6E:
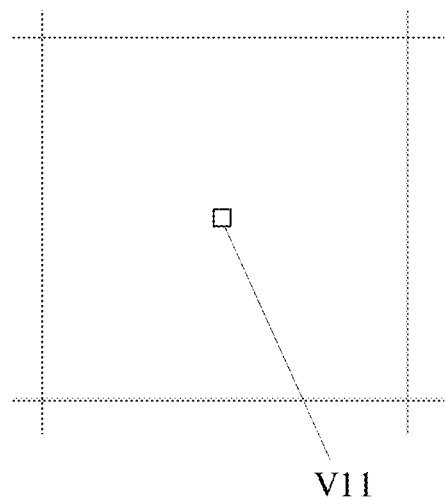

For example, FIG. 6D is a schematic planar view of the planarization layer IL1, and a via V10 is provided in the planarization layer IL1. FIG. 6E is a schematic planar view of the first passivation layer IL2, and a via V11 is provided in the first passivation layer IL2. For example, the planarization layer IL1 and the first passivation layer IL2 constitute the interlayer insulation layer IL between the pixel driving circuit and the first electrode layer, and the via V10 communicates with the via V11 to form the via V1 in the interlayer insulation layer IL.

Figure 6F:
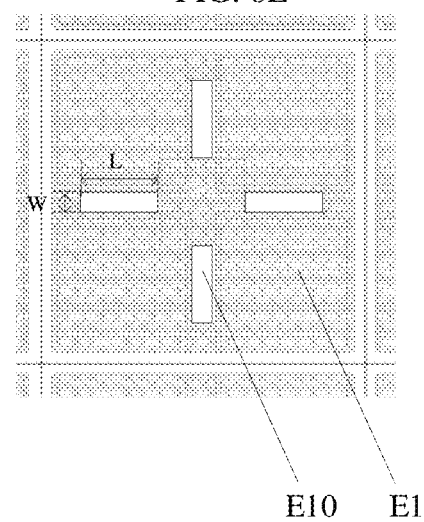

For example, FIG. 6F is a schematic planar view of a first electrode layer, which includes a plurality of first electrodes E1 used for the plurality of pixel units PX. The plurality of photosensitive elements P are arranged on the first electrode E1 of each pixel unit PX, and each first electrode E1 includes first hollowed-out portions E10 between the photosensitive elements P. For example, the length L of the first hollowed-out portion E10 ranges from 6 μm to 40 μm, such as 10 μm, 20 μm or 30 μm, and the width W of the first hollowed-out portion E10 ranges from 2.5 μm to 10 μm, such as 3 μm, 5 μm or 7 μm.

Figure 6G:
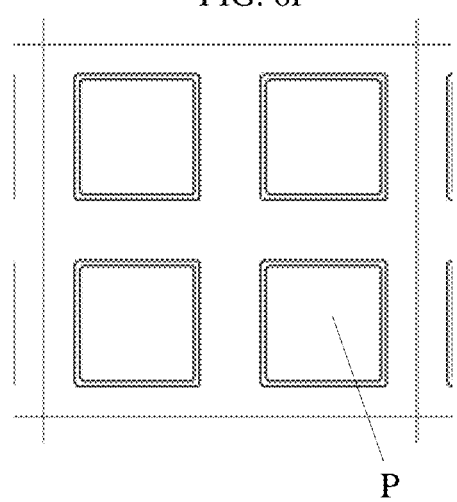

FIG. 6G is a schematic planar view of the plurality of photosensitive elements P, and the plurality of photosensitive elements P are arranged at intervals on the first electrode E1.

Figure 6H:
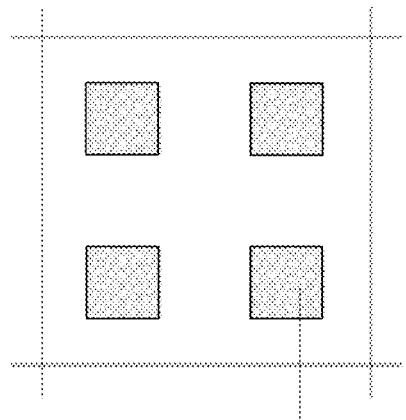

FIG. 6H is a schematic planar view of the second electrode layer, the second electrode layer includes a plurality of second electrodes E2 which are respectively arranged on the plurality of photosensitive elements P, so that the second electrodes E2 and the first electrode E1 jointly drive the plurality of photosensitive elements P; on the other hand, the plurality of second electrodes E2 together with the first electrode E1 can further form the capacitor C.

Figure 6I:
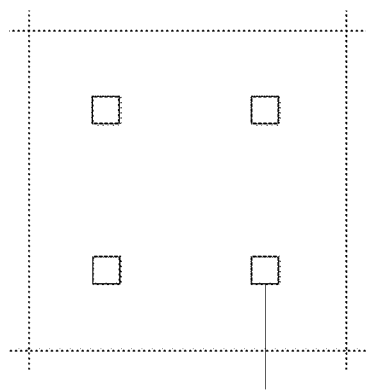

For example, FIG. 6I is a schematic planar view of the second buffer layer 104, the organic insulation layer 105 and the second passivation layer 106, and a plurality of vias V2 are provided in the second buffer layer 104, the organic insulation layer 105 and the second passivation layer 106.

Figure 6J:
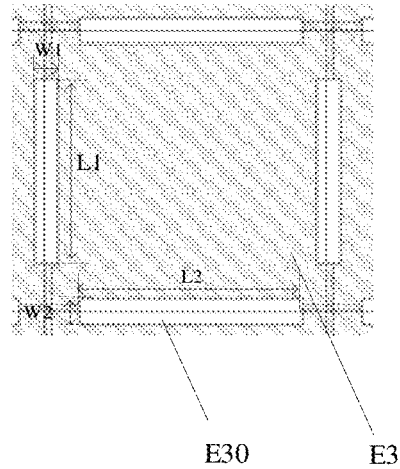

FIG. 6J is a schematic planar view of the third electrode layer E3. The plurality of second electrodes E2 are respectively connected to the third electrode layer E3 through the plurality of vias V2, and the third electrode layer E3 includes a plurality of second hollowed-out portions E30 located between adjacent pixel units PX. For example, in FIG. 6J, the second hollowed-out portion E30 extending laterally at least partially overlaps with the signal scanning line Vr, and the length L2 of the second hollowed-out portion ranges from 20 μm to 97 μm, such as 30 μm, 40 μm or 50 μm, and the width of the second hollowed-out portion ranges from 6 μm to 20 μm, such as 8 μm, 10 μm or 15 μm. In FIG. 6J, the second hollowed-out portion E30 extending longitudinally partially overlaps with the signal readout line Vout, and the length L1 of the second hollowed-out portion ranges from 8 μm to 97 μm, such as 10 μm, 20 μm or 50 μm, and the width W1 of the second hollowed-out portion ranges from 2.5 μm to 20 μm, such as 5 μm, 10 μm or 15 μm.

Figure 6K:
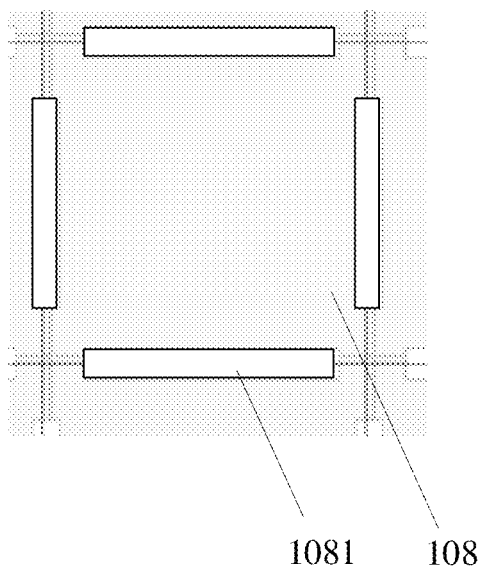

FIG. 6K is a schematic planar view of the electrostatic shielding layer 108. In this example, the electrostatic shielding layer 108 has a pattern similar to that of the third electrode layer E3, for example, has a plurality of third hollowed-out portions 1081 located between adjacent pixel units PX, and the third hollowed-out portions 1081 are in one-to-one correspondence with and overlap with the second hollowed-out portions E30 in the direction perpendicular to the board surface of the base substrate 10.

Figure 7:
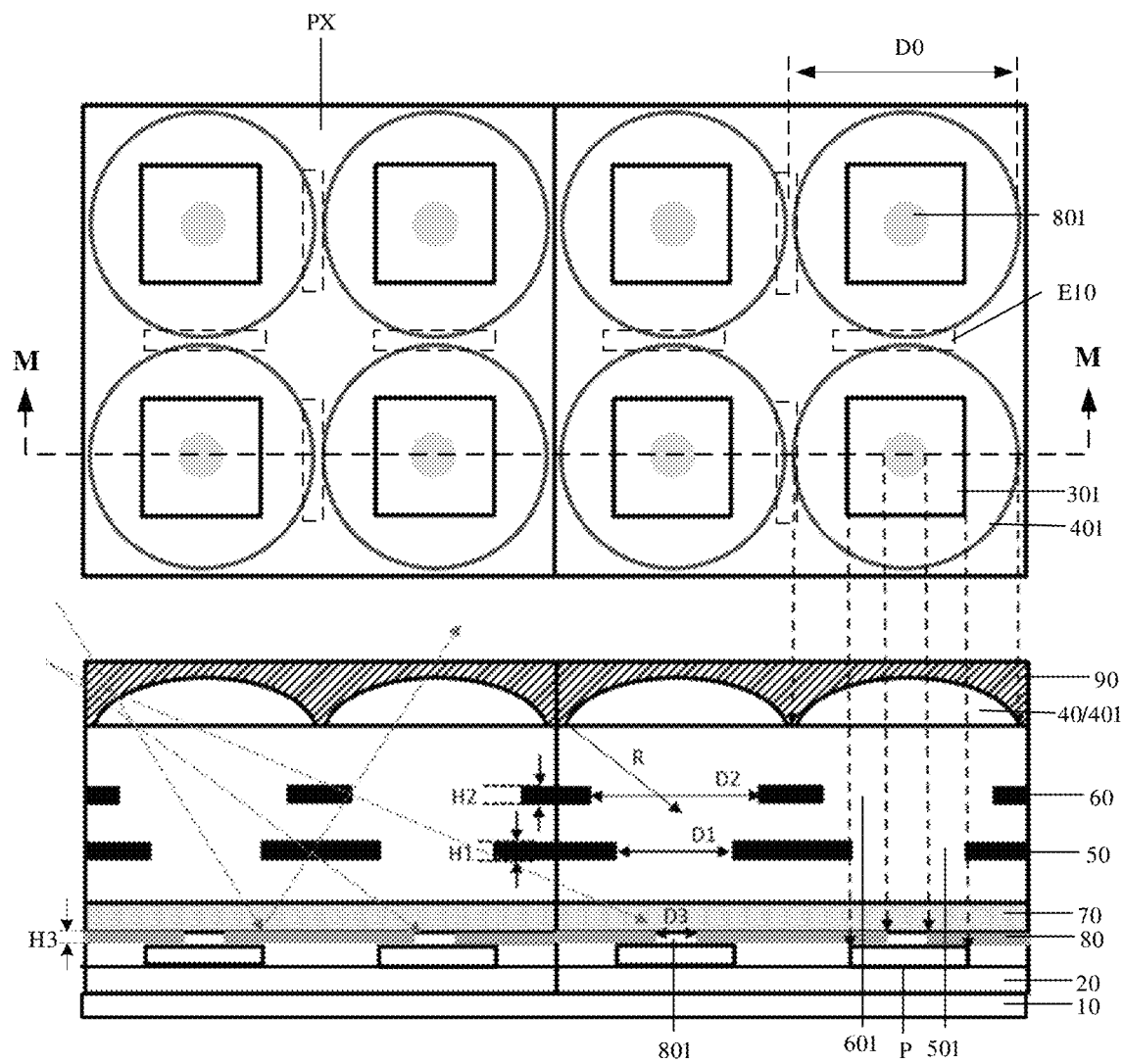
FIG. 7 is a schematic planar view of a texture recognition device provided by at least one embodiment of the present disclosure and a schematic cross-sectional view taken along a line M-M in the schematic planar view.

For example, in some embodiments, FIG. 7 is a schematic planar view of a texture recognition device provided by at least one embodiment of the present disclosure and a schematic cross-sectional view taken along a line M-M in the schematic planar view. As shown in FIG. 7, the texture recognition device may further include a first diaphragm layer 20, the first diaphragm layer 20 is arranged on the side of the electrostatic shielding layer 108 away from the base substrate 10. For clarity, the structure between the photosensitive elements P and the electrostatic shielding layer 108 (including the electrostatic shielding layer 108) is omitted in FIG. 7. As shown in FIG. 7, the first diaphragm layer 50 includes a plurality of first light transmission openings 501. In the direction perpendicular to the board surface of the base substrate 10, the plurality of first light transmission openings 501 are in one-to-one correspondence with and overlap with the plurality of photosensitive elements P. The plurality of first light transmission openings 501 are respectively configured to transmit signal light incident on the plurality of photosensitive elements P, and block unnecessary light such as light at a certain angle (a certain large angle with the board surface of the base substrate 10) and the signal light used for the adjacent photosensitive element P, for example, the light indicated by the dotted line in FIG. 7, so as to further prevent signal crosstalk and other undesirable phenomena.

For example, in some embodiments, as shown in FIG. 7, in a direction parallel to the board surface of the base substrate 10, the diameter of each first light transmission opening 501 is D1, and 2 μm≤D1≤50 μm, for example, D1 is 10 μm, 20 μm or 30 μm, etc.

For example, in the direction parallel to the board surface of the base substrate 10, the shape of each of the plurality of first light transmission openings 501 may be rectangular, square, circular or the like. For example, in the case where the shape of each of the plurality of first light transmission openings 501 is square, the above D1 may be the side length of the square; in the case where the shape of each of the plurality of first light transmission openings 501 is rectangular, the above D1 may be the length of the diagonal of the rectangle; in the case where the shape of each of the plurality of first light transmission openings 501 is circular, the above D1 may have the diameter of the circular shape.

For example, in some embodiments, a material of the first diaphragm layer 50 may be a light absorption material, such as a black matrix material, such as a black light absorption material formed by adding a black dye to a resin material, so that the reflection of light by the first diaphragm layer 50 can be reduced or even eliminated, thereby preventing the reflected light from producing an adverse effect on texture recognition. For example, the plurality of first light transmission openings 501 are filled with a transparent resin material, so as to prevent undesirable phenomena such as deformation inside the texture recognition device caused by air gaps in the texture recognition device.

For example, in some embodiments, as shown in FIG. 7, the thickness H1 of the first diaphragm layer 50 ranges from 1 μm to 3 μm, such as 1.5 μm, 2 μm or 2.5 μm, etc., and the distance between the first diaphragm layer 50 and the photosensitive element layer 30 ranges from 5 μm to 20 μm, that is, the distance between the lower surface of the first diaphragm layer 50 and the upper surface of the photosensitive element layer 30 ranges from 5 μm to 20 μm, such as 10 μm, 15 μm or 18 μm, etc. With the above configuration, the first diaphragm layer 50 can effectively realize the crosstalk prevention function.

For example, in some embodiments, as shown in FIG. 7, the texture recognition device may further include a second diaphragm layer 60, which is disposed on the side of the first diaphragm layer 50 away from the base substrate 10. The second diaphragm layer 60 includes a plurality of second light transmission openings 601, the plurality of second light transmission openings 601 are in one-to-one correspondence with and overlap with the plurality of photosensitive elements P in the direction perpendicular to the board surface of the base substrate 10. The plurality of second light transmission openings 601 are respectively configured to transmit the signal light incident on the plurality of photosensitive elements P, and block unnecessary light such as light at a certain angle (at a certain angle with the board surface of the base substrate) and signal light used for the adjacent photosensitive element, for example, the light indicated by the dotted line in FIG. 1, so that adverse phenomena such as signal crosstalk can be further prevented.

For example, in the direction parallel to the board surface of the base substrate 10, the diameter of each second light transmission opening 601 is D2, and 2 μm≤D1≤D2≤50 μm, for example, D2 may be 20 μm, 30 μm or 40 μm, etc.

Similarly, in the direction parallel to the board surface of the base substrate 10, the shape of each second light transmission opening 601 may be rectangular, square or circular. For example, in the case where the shape of each of the plurality of second light transmission openings 601 is square, the above D2 may be the side length of the square; in the case where the shape of each of the second light transmission opening 601 is rectangular, the above D2 may be the length of the diagonal of the rectangle; in the case where the shape of each of the second light transmission opening 601 is circular, the above D2 may have the diameter of the circular shape.

For example, in some embodiments, a material of the second diaphragm layer 60 may be a light absorption material, such as a black matrix material, such as a black light absorption material formed by adding a black dye to a resin material, so that the reflection of light by the second diaphragm layer 60 can be reduced or even eliminated, thereby avoiding the influence of the reflected light on texture recognition. For example, the plurality of second light transmission openings 601 are filled with a transparent resin material, so as to prevent undesirable phenomena such as deformation inside the texture recognition device caused by air gaps in the texture recognition device.

For example, in some embodiments, in a direction perpendicular to the board surface of the base substrate 10, the thickness H2 of the second diaphragm layer 60 ranges from 1 μm to 3 μm, such as 1.5 μm, 2 μm or 2.5 μm, etc., and the distance between the second diaphragm layer 60 and the first diaphragm layer 50 ranges from 5 μm-20 μm, such as 10 μm, 15 μm or 18 μm, etc.

For example, in some embodiments, as shown in FIG. 7, the texture recognition device may further include a visual field diaphragm layer 80 disposed between the electrostatic shielding layer 108 and the first diaphragm layer 50, and the visual field diaphragm layer 80 includes a plurality of third light transmission openings 801, and the plurality of third light transmission openings 801 are in one-to-one correspondence with and overlap with the plurality of photosensitive elements P in the direction perpendicular to the board surface of the base substrate 10. The plurality of third light transmission openings 801 are respectively configured to transmit the signal light incident on the plurality of photosensitive elements P, and block unnecessary light with a large angle (a large angle with the board surface of the base substrate), such as the light indicated by the dotted line in FIG. 7, so as to further prevent the occurrence of undesirable phenomena such as signal crosstalk and so on.

For example, in the direction parallel to the board surface of the base substrate 10, the diameter of each third light transmission opening 801 is D3, and 2 μm≤D3≤10 μm, for example, D3 is 5 μm, 7 μm or 9 μm, etc.

For example, in some embodiments, in the direction perpendicular to the board surface of the base substrate 10, the thickness H3 of the visual field diaphragm layer 80 ranges from 300 nm to 500 nm, such as 350 nm, 400 nm or 450 nm.

For example, in some embodiments, a material of the visual field diaphragm layer 80 includes a metal material, such as molybdenum, aluminum, titanium and other metal materials or alloy materials thereof. In this case, in the manufacturing process of the texture recognition device, the visual field diaphragm layer 80 can be formed together in the manufacturing process of the driving circuit layer 20 and the photosensitive element layer 30, thus simplifying the manufacturing process of the texture recognition device.

In the process of texture recognition, besides the signal light used for texture recognition can be sensed by the photosensitive element P, the photosensitive element P can also sense the ambient light incident through the finger. Because the photosensitive element P receives light passively, and cannot actively distinguish the signal light from the ambient light, so the ambient light may interfere with the texture recognition of the photosensitive element P. For example, when the ambient light shines directly above the finger, the ambient light can penetrate the finger and excite the biological tissues in the finger to emit pigment light, the pigment light may interfere with fingerprint recognition. By detection, the pigment light mainly includes light with a wavelength ranging from 580 nm to 850 nm.

For example, in some embodiments, as shown in FIG. 7, the texture recognition device may further include a light filter layer 70 disposed between the visual field diaphragm layer 80 and the first diaphragm layer 50, and the light filter layer 70 is configured to filter out light with a wavelength ranging from 580 nm to 850 nm, that is, the light filter layer 70 is configured to not allow light with a wavelength ranging from 580 nm to 850 nm to pass through, so as to prevent the pigment light from affecting the texture recognition, and thus the texture recognition device can be used in outdoor and other bright light scenes. For example, the optical filter layer 70 can have a high transmittance for signal light that can be used for texture recognition, for example, the optical filter layer 70 can have a high transmittance for visible light with a wavelength in a range of 400 nm~560 nm, so that the photosensitive element P can fully receive the signal light. For example, in some embodiments, the optical filter layer 70 is a green photoresist layer.

For example, in some embodiments, as shown in FIG. 7, the texture recognition device may further include a lens layer 40, the lens layer 40 is disposed on the side of the second diaphragm layer 60 away from the base substrate 10. The lens layer 40 includes a plurality of lens units 401, the plurality of lens units 401 are in one-to-one correspondence with and overlap with the plurality of photosensitive elements P in the direction perpendicular to the board surface of the base substrate 10. Therefore, each of the plurality of photosensitive elements P is provided with a corresponding lens unit 401, so that each lens unit 401 can be more matched with the corresponding one photosensitive element P to perform more accurate light collimation, thereby more accurately controlling the propagation direction of the signal light incident to each photosensitive element, avoiding adverse phenomena such as crosstalk between adjacent pixel units PX, and improving the texture recognition effect of the texture recognition device.

For example, in some embodiments, as shown in FIG. 7, the planar shape of each of the plurality of lens units 401 may be circular. In this case, the curvature radius R of each lens unit 401 may range from 5 μm to 20 μm, such as 7 μm, 10 μm or 15 μm, etc, and the diameter DO of each lens unit 401 may range from 25 μm to 35 μm, such as 27 μm, 30 μm or 32 μm, etc. For example, in other embodiments, the planar shape of each of the plurality of lens units 401 may be rectangular or square, and the embodiments of the present disclosure do not limit the specific form of the plurality of lens units 401.

For example, in some embodiments, the refractive index of a material of the lens layer 40 ranges from 1.6 to 1.7, such as 1.65, etc. Therefore, the plurality of lens units 401 can fully refract the light incident therein, thereby achieving an effective collimation effect and improving the utilization rate of the incident light.

For example, in some embodiments, as shown in FIG. 7, the texture recognition device may further include a planarization layer 90 arranged on the side of the lens layer 40 away from the base substrate 10, and the planarization layer 90 can planarize the unevenness caused by the lens layer 30, and it is beneficial to connect the texture recognition device to other devices, such as a display panel, etc., by the planarization layer 90. For example, in some examples, the planarization layer 90 may be bonded to the display panel by optically transparent adhesive. In this case, because the planarization layer 90 is relatively flat, the optically transparent adhesive has stronger adhesion to the planarization layer 90 and the display panel.

For example, the refractive index of a material of the planarization layer 90 is in a range of 1.35~1.45, such as 1.40, etc. For example, the planarization layer 90 includes an organic material with a refractive index in the range of 1.35~1.45. In at least one embodiment of the present disclosure, the planarization layer 90 is formed by a material with a low refractive index, so that the planarization layer 90 can avoid adverse effects on the propagation of the signal light, such as unnecessary refraction and reflection of the signal light.

For example, in at least one embodiment of the present disclosure, each photosensitive element P has an island shape, and the planar shape of each photosensitive element P may be a square, a rectangle, or the like. For example, in the case where the planar shape of each photosensitive element P is a square, the side length of the square may range from 10 μm to 20 μm, such as 12 μm, 15 μm or 18 μm, etc.

For example, the photosensitive element P may be a photodiode, for example, the photodiode may be a PN type photodiode or a PIN type photodiode, etc. For example, in the case where the photodiode is a PN type photodiode, the photosensitive element P includes a P-type semiconductor layer and an N-type semiconductor layer that are stacked; in the case where the photodiode is a PIN type photodiode, the photosensitive element P includes a P-type semiconductor layer, an intrinsic semiconductor layer and an N-type semiconductor layer that are stacked. For example, the semiconductor material used for the photosensitive element P may include at least one selected from a group consisting of silicon, germanium, selenium, gallium arsenide, etc., and the embodiments of the present disclosure are not limited in this aspect.

For example, in the embodiments of the present disclosure, the base substrate 10 may include a flexible insulation material such as polyimide (PI) or a rigid insulation material such as a glass substrate. For example, the first buffer layer 101 and the second buffer layer 104 may include an inorganic material such as silicon nitride, silicon oxide, silicon oxynitride, or the like. The active layer AT may be made of polysilicon, metal oxide or other materials. The first gate insulation layer 102 and the second gate insulation layer 103 may be made of an inorganic insulation material such as silicon oxide, silicon nitride, silicon oxynitride, or the like. The gate electrode G may be made of a metal material such as copper, aluminum, titanium, cobalt, etc., for example, the gate electrode may be formed into a single-layer structure or a multi-layer structure, such as titanium/aluminum/titanium, molybdenum/aluminum/molybdenum, etc. The first passivation layer IL2, the second passivation layer 106, and the third passivation layer 107 may be made of an inorganic insulation material such as silicon oxide, silicon nitride, silicon oxynitride, or the like. The source/drain electrodes S/D may be made of a metal material such as copper, aluminum, titanium, cobalt, or the like, for example, the source/drain electrodes S/D may be formed into single-layer structures or multi-layer structures such as titanium/aluminum/titanium, molybdenum/aluminum/molybdenum, etc. The first electrode layer includes, for example, metal oxide such as ITO, IZO, etc., or metal such as Ag, Al and Mo or their alloys, etc. For example, the second electrode layer, the third electrode layer and the electrostatic shielding layer 108 include transparent metal oxide such as ITO, IZO, etc. The planarization layer IL1 may be made of an organic insulation material such as polyimide. The embodiments of the present disclosure do not limit the materials of each functional layer.

For example, the texture recognition device provided by the embodiments of the present disclosure may further include other structures, and the details can be referred to related technologies, which are not repeated here.

Figure 8:
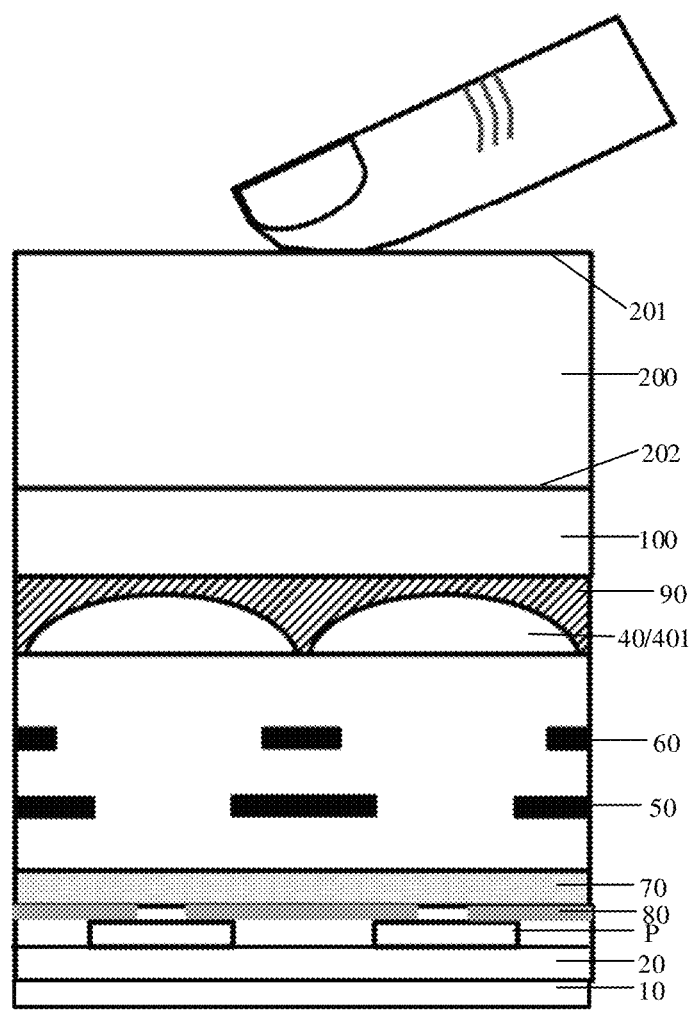
FIG. 8 is a schematic cross-sectional view of a display apparatus provided by at least one embodiment of the present disclosure.

At least one embodiment of the present disclosure further provides a display apparatus. FIG. 8 shows a schematic cross-sectional view of the display apparatus. As shown in FIG. 8, the display apparatus includes a display panel 200 and the texture recognition device provided by at least one embodiment of the present disclosure. The display panel 200 has a display side 201 and a non-display side 202, and allows light to be transmitted from the display side 201 to the non-display side 202. The texture recognition device is disposed on the non-display side 202 of the display panel 200, and is configured to receive the light transmitted from the display side 201 to the non-display side 202 for texture recognition. In the arrangement of the texture recognition device, the photosensitive element layer 30 is closer to the display panel 200 than the base substrate 10.

The display apparatus provided by the embodiments of the present disclosure uses the texture recognition device provided by the embodiments of the present disclosure to recognize textures, and has better texture recognition effect, such as a higher texture recognition speed and a texture recognition accuracy.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a region may be enlarged or narrowed, that is, the drawings are not drawn in a real scale. However, it should understood that, in the case in which a component such as a layer, film, region, substrate or the like is referred to be "on" or "under" another component, the component may be directly on or under the another component or there may be an intermediate component.

(3) In case of no conflict, the embodiments of the present disclosure and the features in the embodiments can be combined with each other to obtain new embodiments.

What have been described above are only specific implementations of the present disclosure, the protection scope of the present disclosure is not limited thereto, and the protection scope of the present disclosure should be based on the protection scope of the claims.

What is claimed is:

1. A texture recognition device, having a plurality of pixel units, and comprising:
   a base substrate,
   a driving circuit layer on the base substrate,
   a first electrode layer on a side of the driving circuit layer away from the base substrate, and
   a photosensitive element layer on a side of the first electrode layer away from the base substrate,
   wherein at least one of the plurality of pixel units comprises a pixel driving circuit in the driving circuit layer, a first electrode in the first electrode layer, and a plurality of photosensitive elements spaced apart from each other in the photosensitive element layer,
   the pixel driving circuit is electrically connected with the first electrode,
   the plurality of photosensitive elements are on a side of the first electrode away from the base substrate, and are electrically connected with the pixel driving circuit through the first electrode;
   the first electrode comprises at least one first hollowed-out portion between two adjacent photosensitive elements of the plurality of photosensitive elements.

2. The texture recognition device according to claim 1, further comprising an interlayer insulation layer between the driving circuit layer and the first electrode layer, wherein the interlayer insulation layer comprises a via, and the first electrode is electrically connected with the pixel driving circuit through the via;
   an orthographic projection of the via on the base substrate does not overlap with orthographic projections of the plurality of photosensitive elements on the base substrate.

3. The texture recognition device according to claim 1, wherein at least one of the plurality of pixel units includes a plurality of photosensitive elements arranged in an M*N array, wherein M is a positive integer greater than or equal to 1, and N is a positive integer greater than 1.

4. The texture recognition device according to claim 3, wherein M is 2, N is 2, and the plurality of photosensitive elements are arranged in a 2*2 array.

5. The texture recognition device according to claim 2, further comprising a second electrode layer on a side of the photosensitive element layer away from the base substrate,
   wherein the at least one pixel unit further comprises a plurality of second electrodes in the second electrode layer, and the plurality of second electrodes are respectively on a side of the plurality of photosensitive elements away from the base substrate.

6. The texture recognition device according to claim 5, further comprising a third electrode layer on a side of the second electrode layer away from the base substrate, wherein the plurality of second electrodes are electrically connected with the third electrode layer.

7. The texture recognition device according to claim 6, wherein the third electrode layer comprises at least one second hollowed-out portion between two adjacent pixel units of the plurality of pixel units.

8. The texture recognition device according to claim 7, wherein the driving circuit layer further comprises a signal scanning line electrically connected with the pixel driving circuit,
   an orthographic projection of the at least one second hollowed-out portion on the base substrate at least partially overlaps with an orthographic projection of the signal scanning line on the base substrate.

9. The texture recognition device according to claim 7, wherein the driving circuit layer further comprises a signal readout line electrically connected with the pixel driving circuit,
   an orthographic projection of the at least one second hollowed-out portion on the base substrate at least partially overlaps with an orthographic projection of the signal readout line on the base substrate.

10. The texture recognition device according to claim 9, wherein the second hollowed-out portion at least partially overlapping with the signal readout line has a length ranging from 8 μm to 97 μm, and has a width ranging from 2.5 μm to 20 μm;

the second hollowed-out portion at least partially overlapping with the signal scanning line has a length ranging from 20 μm to 97 μm, and has a width ranging from 6 μm to 20 μm.

11. The texture recognition device according to claim 6, further comprising an electrostatic shielding layer on a side of the third electrode layer away from the base substrate,
wherein an orthographic projection of the third electrode layer on the base substrate is within an orthographic projection of the electrostatic shielding layer on the base substrate.

12. The texture recognition device according to claim 11, further comprising a first diaphragm layer on a side of the electrostatic shielding layer away from the base substrate, wherein the first diaphragm layer comprises a plurality of first light transmission openings,
in a direction perpendicular to a board surface of the base substrate, the first light transmission openings are in one-to-one correspondence with and overlap with the plurality of photosensitive elements.

13. The texture recognition device according to claim 12, further comprising a second diaphragm layer on a side of the first diaphragm layer away from the base substrate, wherein the second diaphragm layer comprises a plurality of second light transmission openings,
in the direction perpendicular to the board surface of the base substrate, the second light transmission openings are in one-to-one correspondence with and overlap with the plurality of photosensitive elements;
in a direction parallel to the board surface of the base substrate, a diameter of each of the plurality of first light transmission openings is D1, a diameter of each of the plurality of second light transmission openings is D2, and 2 μm≤D1≤D2≤50 μm.

14. The texture recognition device according to claim 12, further comprising a visual field diaphragm layer between the electrostatic shielding layer and the first diaphragm layer, wherein the visual field diaphragm layer comprises a plurality of third light transmission openings,
in the direction perpendicular to the board surface of the base substrate, the third light transmission openings are in one-to-one correspondence with and overlap with the plurality of photosensitive elements.

15. The texture recognition device according to claim 13, further comprising a lens layer on a side of the second diaphragm layer away from the base substrate and a planarization layer on a side of the lens layer away from the base substrate,
wherein the lens layer comprises a plurality of lens units, and in the direction perpendicular to the board surface of the base substrate, the plurality of lens units are in one-to-one correspondence with and overlap with the plurality of photosensitive elements;
a refractive index of a material of the planarization layer ranges from 1.35 to 1.45.

16. The texture recognition device according to claim 2, wherein the pixel driving circuit comprises a first thin film transistor, a second thin film transistor and a third thin film transistor;
a control terminal of the first thin film transistor is connected with a signal scanning line, and a first source-drain terminal of the first thin film transistor and a second source-drain terminal of the first thin film transistor are respectively connected with a signal readout line and a first source-drain terminal of the second thin film transistor; a control terminal of the second thin film transistor is connected with a first source-drain terminal of the third thin film transistor, and a second source-drain terminal of the second thin film transistor is connected with a power line; a control terminal of the third thin film transistor is connected with a reset signal line, and a second source-drain terminal of the third thin film transistor is connected with the power line.

17. The texture recognition device according to claim 16, wherein, for the pixel driving circuit of each of the plurality of pixel units, the first thin film transistor and the second thin film transistor are arranged on a first side of the via comprised in the interlayer insulation layer, and the third thin film transistor is arranged on a second side of the via, and the first side and the second side are opposite to each other.

18. The texture recognition device according to claim 16, wherein an orthographic projection of the power line on the base substrate partially overlaps with an orthographic projection of at least part of the plurality of photosensitive elements on the base substrate.

19. A display apparatus comprising:
a display panel, having a display side and a non-display side and allowing light to be transmitted from the display side to the non-display side, and
the texture recognition device according to claim 1, wherein the texture recognition device is on the non-display side of the display panel and is configured to receive the light transmitted from the display side to the non-display side for texture recognition,
wherein the photosensitive element layer is closer to the display panel than the base substrate.

* * * * *